(12) United States Patent
Tajalli

(10) Patent No.: US 12,063,034 B2
(45) Date of Patent: Aug. 13, 2024

(54) LINE DRIVER IMPEDANCE CALIBRATION FOR MULTI-WIRE DATA BUS

(71) Applicant: KANDOU LABS SA, Lausanne (CH)

(72) Inventor: Armin Tajalli, Lausanne (CH)

( * ) Notice: Subject to any disclaimer, the term of this patent is extended or adjusted under 35 U.S.C. 154(b) by 57 days.

(21) Appl. No.: 17/823,401

(22) Filed: Aug. 30, 2022

(65) Prior Publication Data
US 2024/0072795 A1 Feb. 29, 2024

(51) Int. Cl.
H03K 17/687 (2006.01)
H03K 19/00 (2006.01)
H04L 12/40 (2006.01)

(52) U.S. Cl.
CPC ..... *H03K 17/6872* (2013.01); *H03K 19/0005* (2013.01); *H04L 12/40* (2013.01); *H03K 2217/0063* (2013.01); *H03K 2217/0072* (2013.01)

(58) Field of Classification Search
CPC ........... H03K 17/6872; H03K 19/0005; H03K 2217/0063; H03K 2217/0072; H03K 17/6874; H03K 17/6871; H04L 12/40; H04L 12/40013
See application file for complete search history.

(56) References Cited

U.S. PATENT DOCUMENTS

| | | | |
|---|---|---|---|
| 5,539,360 A | 7/1996 | Vannatta et al. |
| 6,172,634 B1 | 1/2001 | Leonowich et al. |
| 6,343,024 B1 | 1/2002 | Zabroda |
| 6,772,351 B1 | 8/2004 | Werner et al. |
| 7,093,145 B2 | 8/2006 | Werner et al. |
| 7,130,944 B2 | 10/2006 | Perino et al. |
| 7,176,823 B2 | 2/2007 | Zabroda |
| 7,269,212 B1 | 9/2007 | Chau et al. |
| 7,372,295 B1 | 5/2008 | Wei |
| 7,456,778 B2 | 11/2008 | Werner et al. |
| 7,462,956 B2 | 12/2008 | Lan et al. |
| 7,570,704 B2 | 8/2009 | Nagarajan et al. |
| 7,768,312 B2 | 8/2010 | Hirose |
| 7,826,551 B2 | 11/2010 | Lee et al. |
| 7,859,356 B2 | 12/2010 | Pandey |
| 8,040,200 B2 | 10/2011 | Minegishi et al. |

(Continued)

FOREIGN PATENT DOCUMENTS

CN 101478286 A 7/2009

OTHER PUBLICATIONS

International Search Report and Written Opinion for PCT/US2023/073146, 1-16 (16 pages).

(Continued)

*Primary Examiner* — Jung Kim

(57) ABSTRACT

Methods and systems are described for an output driver composed of complementary metal-oxide semiconductor (CMOS) devices, the output driver having a line driver control stage configured to selectively output a reference voltage or a first supply voltage at the control stage output node in response to a data signal, and a line driver output circuit configured to generate an output signal on a multi-wire bus, wherein the CMOS devices of the line driver output circuit are calibrated to have an on-resistance matched to a termination impedance via first and second supply voltages provided to the line driver control stage and the line driver output circuit, respectively.

20 Claims, 12 Drawing Sheets

(56) References Cited

U.S. PATENT DOCUMENTS

| | | |
|---|---|---|
| 8,199,849 B2 | 6/2012 | Oh et al. |
| 8,284,848 B2 | 10/2012 | Nam et al. |
| 8,295,336 B2 | 10/2012 | Lutz et al. |
| 8,520,348 B2 * | 8/2013 | Dong .................. G06F 13/4086 326/30 |
| 8,975,948 B2 | 3/2015 | Gonzalez Diaz |
| 9,071,476 B2 | 6/2015 | Fox et al. |
| 9,106,220 B2 | 8/2015 | Fox et al. |
| 9,124,557 B2 | 9/2015 | Fox et al. |
| 9,288,082 B1 | 3/2016 | Ulrich et al. |
| 9,300,503 B1 | 3/2016 | Holden et al. |
| 9,362,974 B2 | 6/2016 | Fox et al. |
| 9,544,015 B2 | 1/2017 | Ulrich |
| 9,596,109 B2 | 3/2017 | Fox et al. |
| 9,710,412 B2 | 7/2017 | Sengoku |
| 9,843,324 B1 | 12/2017 | Hafizi et al. |
| 9,917,711 B2 | 3/2018 | Ulrich |
| 2001/0006538 A1 | 7/2001 | Simon et al. |
| 2002/0125933 A1 | 9/2002 | Tamura et al. |
| 2003/0085763 A1 | 5/2003 | Schrodinger et al. |
| 2004/0085091 A1 | 5/2004 | Brox |
| 2007/0002954 A1 | 1/2007 | Cornelius et al. |
| 2007/0121716 A1 | 5/2007 | Nagarajan et al. |
| 2008/0012598 A1 | 1/2008 | Mayer et al. |
| 2009/0002030 A1 | 1/2009 | Stojanovic et al. |
| 2009/0237109 A1 | 9/2009 | Haig et al. |
| 2010/0046600 A1 | 2/2010 | Zerbe et al. |
| 2011/0268225 A1 | 11/2011 | Cronie et al. |
| 2012/0125665 A1 | 5/2012 | Masuda |
| 2012/0133438 A1 | 5/2012 | Tsuchi et al. |
| 2013/0307614 A1 | 11/2013 | Dai |
| 2014/0035549 A1 | 2/2014 | Hafizi et al. |
| 2014/0159769 A1 | 6/2014 | Hong et al. |
| 2014/0177699 A1 | 6/2014 | Tan et al. |
| 2014/0254712 A1 | 9/2014 | Lee et al. |
| 2015/0063494 A1 | 3/2015 | Simpson et al. |
| 2015/0331820 A1 | 11/2015 | Sengoku |
| 2015/0349835 A1 | 12/2015 | Fox et al. |
| 2015/0381232 A1 | 12/2015 | Ulrich |
| 2016/0373141 A1 | 12/2016 | Chou et al. |
| 2017/0302267 A1 | 10/2017 | Luo |
| 2017/0359211 A1 | 12/2017 | Dickson et al. |
| 2019/0073332 A1 | 3/2019 | Amiri et al. |

OTHER PUBLICATIONS

Jang, Young-Chan, "A Swing Level Controlled Transmitter for Single-Ended Signaling with Center-Tapped Termination", IEICE Transactions on Electronics, Institute of Electronics, vol. E93C, No. 6, Jun. 1, 2010, 861-863 (3 pages).

* cited by examiner

LINE DRIVER IMPEDANCE CALIBRATION FOR MULTI-WIRE DATA BUS

REFERENCES

The following references are herein incorporated by reference in their entirety for all purposes:

U.S. Patent Publication No. 2011/0268225 of U.S. patent application Ser. No. 12/784,414, filed May 20, 2010, naming Harm Cronie and Amin Shokrollahi, entitled "Orthogonal Differential Vector Signaling" (hereinafter "Cronie");

U.S. Pat. No. 9,124,557, granted Sep. 1, 2015, naming John Fox, Brian Holden, Peter Hunt, John D Keay, Amin Shokrollahi, Richard Simpson, Anant Singh, Andrew Kevin John Stewart, and Giuseppe Surace, entitled "Methods and Systems for Chip-to-chip Communication with Reduced Simultaneous Switching Noise" (hereinafter called "Fox I");

U.S. Pat. No. 9,106,220, granted Aug. 11, 2015, naming John Fox, Brian Holden, Ali Hormati, Peter Hunt, John D Keay, Amin Shokrollahi, Anant Singh, Andrew Kevin John Stewart, Giuseppe Surace, and Roger Ulrich, entitled "Methods and Systems for High Bandwidth Chip-to-Chip Communications Interface" (hereinafter called "Fox II");

U.S. Pat. No. 9,071,476, granted Jun. 30, 2015, naming John Fox, Brian Holden, Peter Hunt, John D Keay, Amin Shokrollahi, Andrew Kevin John Stewart, Giuseppe Surace, and Roger Ulrich, entitled "Methods and Systems for High Bandwidth Chip-to-Chip Communications Interface" (hereinafter called "Fox III");

U.S. Pat. No. 9,596,109, granted Mar. 14, 2017, naming John Fox, Brian Holden, Ali Hormati, Peter Hunt, John D Keay, Amin Shokrollahi, Anant Singh, Andrew Kevin John Stewart, and Giuseppe Surace, entitled "Methods and Systems for High Bandwidth Communications Interface" (hereinafter called "Fox IV");

U.S. Pat. No. 9,300,503, granted Mar. 29, 2016, naming Brian Holden, Amin Shokrollahi, and Anant Singh, entitled "Methods and Systems for Skew Tolerance in and Advanced Detectors for Vector Signaling Codes for Chip-to-Chip Communication" (hereinafter called "Holden");

U.S. Pat. No. 9,288,082, granted Mar. 15, 2016, naming Roger Ulrich and Peter Hunt, entitled "Circuits for Efficient Detection of Vector Signaling Codes for Chip-to-Chip Communications using Sums of Differences" (hereinafter called "Ulrich").

BACKGROUND

In communication systems, information may be transmitted from one physical location to another. Furthermore, it is typically desirable that the transport of this information is reliable, is fast and consumes a minimal amount of resources. One of the most common information transfer media is the serial communications link, which may be based on a single wire circuit relative to ground or other common reference, multiple such circuits relative to ground or other common reference, or multiple circuits used in relation to each other.

In the general case, a serial communications link is used over multiple time periods. In each such time period, a signal or signals over the link represents, and thus conveys, some amount of information typically measured in bits. Thus, at a high level, a serial communications link connects a transmitter to a receiver and the transmitter transmits a signal or signals each time period, the receiver receives signal or signals approximating those transmitted (as the result of signal degradation over the link, noise, and other distortions). The information being conveyed by the transmitter is "consumed" by the transmitter, and representative signals are generated. The receiver attempts to determine the conveyed information from the signals it receives. In the absence of overall errors, the receiver can output exactly the bits that were consumed by the transmitter.

The optimum design of a serial communications link often depends on the application for which it is used. In many cases, there are trade-offs between various performance metrics, such as bandwidth (number of bits that can be conveyed per unit time and/or per period), pin efficiency (number of bits or bit equivalents that can be conveyed at one time divided by the number of wires required for that conveyance), power consumption (units of energy consumed by the transmitter, signal logic, receiver, etc. per bit conveyed), SSO resilience and cross-talk resilience, and expected error rate.

An example of a serial communications link is a differential signaling (DS) link. Differential signaling operates by sending a signal on one wire and the opposite of that signal on a paired wire; the signal information is represented by the difference between the wires rather than their absolute values relative to ground or other fixed reference. Differential signaling enhances the recoverability of the original signal at the receiver over single ended signaling (SES), by cancelling crosstalk and other common-mode noise. There are a number of signaling methods that maintain the desirable properties of DS while increasing pin-efficiency over DS. Many of these attempts operate on more than two wires simultaneously, using binary signals on each wire, but mapping information in groups of bits.

Vector signaling is a method of signaling. With vector signaling, pluralities of signals on a plurality of wires are considered collectively although each of the plurality of signals may be independent. Each of the collective signals is referred to as a component and the number of plurality of wires is referred to as the "dimension" of the vector. In some embodiments, the signal on one wire is entirely dependent on the signal on another wire, as is the case with DS pairs, so in some cases the dimension of the vector may refer to the number of degrees of freedom of signals on the plurality of wires instead of the number of wires in the plurality of wires.

With binary vector signaling, each component takes on a coordinate value (or "coordinate", for short) that is one of two possible values. As an example, eight SES wires may be considered collectively, with each component/wire taking on one of two values each signal period. A "code word" of this binary vector signaling is one of the possible states of that collective set of components/wires. A "vector signaling code" or "vector signaling vector set" is the collection of valid possible code words for a given vector signaling encoding scheme. A "binary vector signaling code" refers to a mapping and/or set of rules to map information bits to binary vectors. In the example of eight SES wires, where each component has a degree of freedom allowing it to be either of the two possible coordinates, the number of code words in the collection of code words is 2^8, or 256. As with SES or DS links, output drivers used with a binary vector signaling code need only emit two distinct voltage- or current-levels, corresponding to the two possible coordinate values for each vector element.

With non-binary vector signaling, each component has a coordinate value that is a selection from a set of more than two possible values. A "non-binary vector signaling code" refers to a mapping and/or set of rules to map information bits to non-binary vectors. The corresponding output driver for a non-binary vector signaling code must be capable of emitting multiple voltage- or current-levels corresponding to the selected coordinate values for each vector output.

Examples of vector signaling methods are described in Cronie, Fox I, Fox II, Fox III, Fox IV, and Holden.

BRIEF DESCRIPTION

Methods and systems are described for a fully complementary metal-oxide semiconductor (CMOS) line driver, the line driver including a line driver control stage having two field effect transistors (FETs) having respective source terminals connected to a reference voltage and a first supply voltage, and the drain terminals connected to a control stage output node, and configured to controllably provide the reference voltage or the first supply voltage at the control stage output node in response to a data signal. The line driver further includes a line driver output circuit having a high-side FET circuit and a low-side FET circuit, each FET circuit having gate terminal inputs connected to the control stage output node, having drain outputs connected to a wire of a multiwire bus, and having respective source nodes connected to a second supply voltage and the reference voltage, respectively, the high-side FET circuit configured to have an on-resistance associated with a gate-source voltage determined by the reference voltage and the second supply voltage, and the low-side FET circuit configured to have an on-resistance associated with a gate-source voltage determined by the reference voltage and the first supply voltage. A low-side on-resistance calibration circuit is configured to generate the first supply voltage based on a voltage drop associated with a replica low-side FET circuit relative to a first voltage drop across a first replica termination impedance element, and a high-side on-resistance calibration circuit is configured to generate the second supply voltage based on a voltage drop associated with a replica high-side FET circuit relative to a second voltage drop across a second replica termination impedance element.

This Brief Summary is provided to introduce a selection of concepts in a simplified form that are further described below in the Detailed Description. This Brief Summary is not intended to identify key or essential features of the claimed subject matter, nor is it intended to be used as an aid in determining the scope of the claimed subject matter. Other objects and/or advantages of the present invention will be apparent to one of ordinary skill in the art upon review of the Detailed Description and the included drawings.

DETAILED DESCRIPTION

Despite the increasing technological ability to integrate entire systems into a single integrated circuit, multiple chip systems and subsystems retain significant advantages. For purposes of description and without limitation, example embodiments of at least some aspects of the invention herein described assume a systems environment of at least one point-to-point communications interface connecting two integrated circuit chips representing a transmitter and a receiver, wherein the communications interface is supported by at least one interconnection group of high-speed transmission line signal wires providing medium loss connectivity at high speed.

Figure 1:
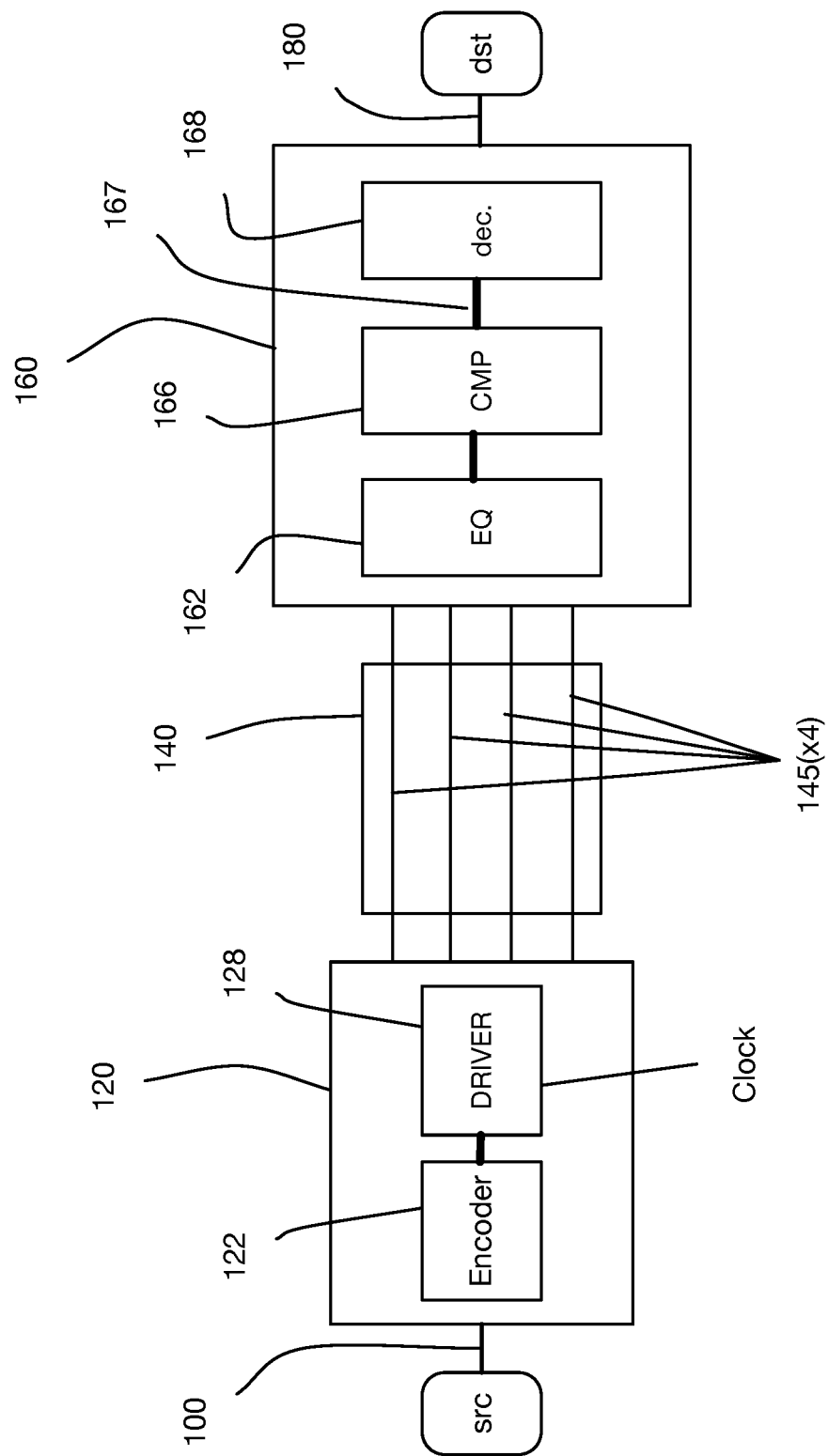
FIG. 1 is a block diagram of a system for communicating information from a transmitter to a receiver over a plurality of wires of a multi-wire bus.

An example of a systems environment incorporating communication of information over a plurality of wires of a multi-wire bus is shown in FIG. 1. As will be subsequently described, one goal of the present invention is to provide improved performance, particularly regarding a low-power output driver composed of CMOS components that is calibrated via supply voltages to maintain a constant output impedance over process variation, voltage and temperature (PVT).

Information to be transmitted 100 is obtained from a source SRC and presented to transmitter 120. Within the transmitter, the information may be optionally encoded 122 and presented to transmit driver 128, generating physical representations of the signals on wires 145 which together comprise the multi-wire bus 140.

Receiver 160 accepts physical signals from communications channel 140, detects the received signals using, as one example, a collection of comparators 166, and then may decode 168 those detected values 167 to obtain the received information 180 output to a destination device DST. For some preferred encoder mappings, detected binary values 167 may map directly to bits of received information 180, making an explicit decoding operation unnecessary. In some embodiments, the comparators 166 may correspond to multi-input comparators In a practical embodiment, signals 145 may undergo significant change in amplitude, waveform, and other characteristics between emission by transmitter 120 and arrival at receiver 160, due to the transmission characteristics of communications channel 140. Therefore, it is common practice to incorporate signal amplification and/or equalization 162 into communications channel receivers.

Physical Channel Characteristics

For purposes of description and without limitation, a communications channel comprised of at least one group of, as a first example, four microstripline wires separated by a dielectric layer from a ground plane is assumed. The four wires of the group are routed together with homogenous fabrication characteristics, to minimize variations in attenuation and propagation velocity. It is further assumed that each wire in this channel is terminated at each end in its characteristic transmission line impedance. Thus, following conventional good practice for a typical transmission line impedance of 50 ohms, signals are issued by a transmitter having a source impedance of 50 ohms, and are detected at the receiver as voltages across or current through a 50 ohm termination resistance. As a second example, the group size is increased to six wires with all other characteristics as previously described. Increasing the group size enables the use of codes capable of communicating more information per wire (known as "pin efficiency") at the cost of more complex routing and fabrication constraints to ensure all wires of the group maintain the same transmission line characteristics.

Figure 2:
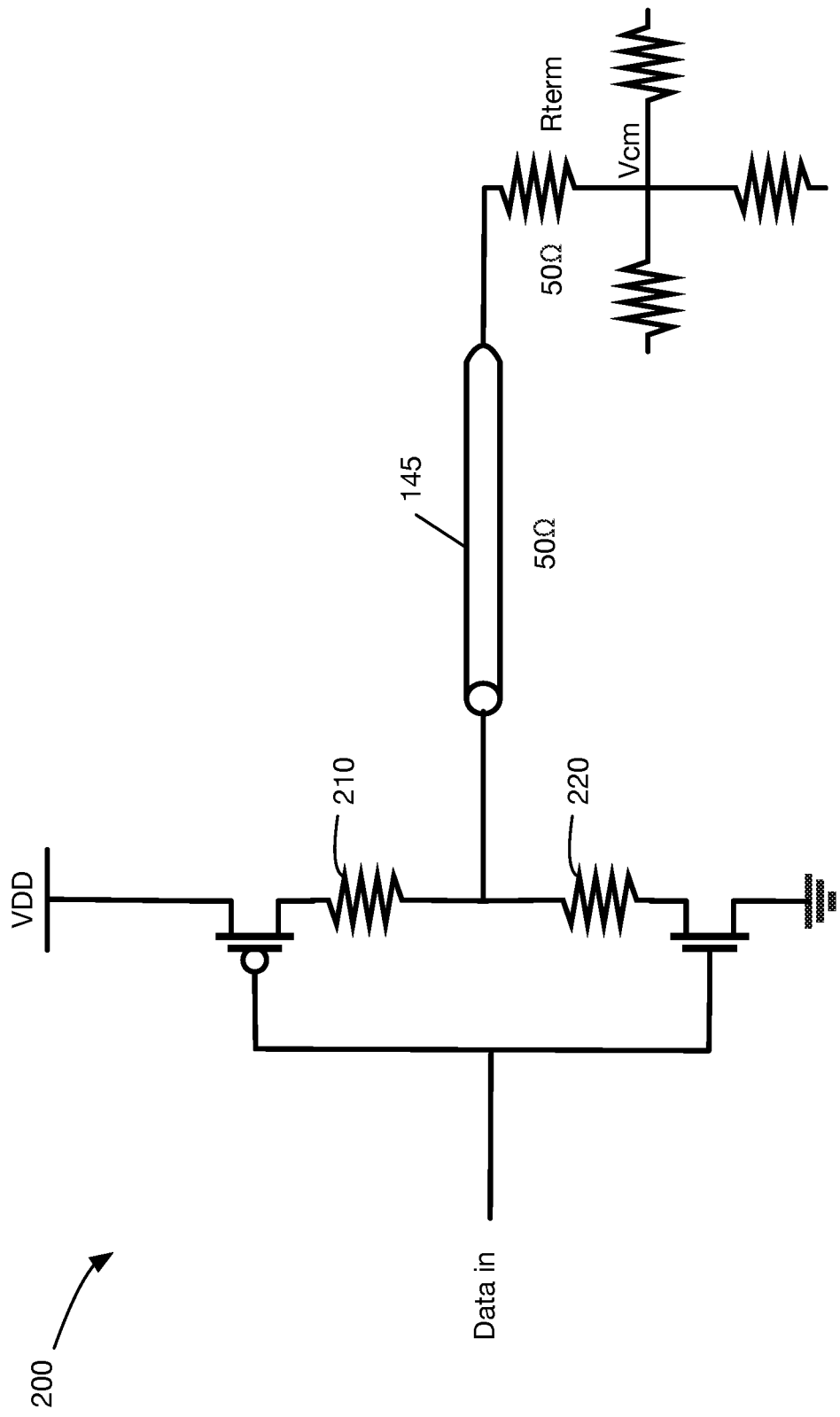
FIG. 2 is a schematic of a prior art line driver.

FIG. 2 is a schematic of a prior art line driver. As shown in FIG. 2, the prior art line driver includes dedicated impedance elements 210 and 220 connected in series between the wire 145 and the source of the PMOS and NMOS devices, respectively. In one particular embodiment, for a characteristic impedance of the wire 145 being 50 ohms, each of resistors 210 and 220 may have impedances of approximately 40 ohms while the NMOS and PMOS devices have impedances of approximately 10 ohms. In such a scenario, the size of the PMOS and NMOS are relatively large to achieve a small impedance value. In such a driver, the large PMOS/NMOS devices and dedicated impedances 210 and 220 consume a large amount of power and impose increased loading characteristics on the wire 145. Another problem that may arise from the driver of FIG. 2 is having to add/remove PMOS and NMOS elements in parallel to achieve output impedance matching over PVT.

ENRZ Code

One exemplary orthogonal differential vector signaling (ODVS) code is called "Ensemble NRZ" code or "ENRZ", which refers to a vector signaling code and associated logic for such code wherein a transmitter consumes three bits and outputs a series of signals on four wires in each symbol period. The ENRZ code is based on a size 4 Hadamard matrix. In some embodiments, parallel configurations comprising more than one group may be used, with each group comprising three bits transmitted on four wires per symbol period and an ENRZ encoder and an ENRZ decoder per group. With an ENRZ code, there are four signal wires and four possible coordinate values, represented herein as +1, +⅓, −⅓, and −1. The ENRZ code words are balanced, in that each code word is either one of the four permutations of (+1, −⅓, −⅓, −⅓) or one of the four permutations of (−1, +⅓, +⅓, +⅓), all such permutations summing to the equivalent of a zero value. It should be noted that although the constellation of all code words utilizes four distinct signal levels, only two signal levels will be utilized in any one code word.

In a specific embodiment, a +1 might be sent as a signal using an offset of 200 mV, while a −1 is sent as a signal using an offset of −200 mV, a +⅓ is sent as a signal using an offset of 66 mV, and a −⅓ is sent as a signal using an offset of −66 mV, wherein the voltage levels are with respect to a fixed reference. Note that the average of all of the signals sent (or received, disregarding asymmetric effects of skew, crosstalk, and attenuation) in any single time interval regardless of the code word represented is "0", corresponding to the fixed reference voltage. There are eight distinct code words in H4, which is sufficient to encode three binary bits per transmitted symbol interval.

Other variants of the H4 coding described above exist as well. The signal levels are given as examples, without limitation, and represent incremental signal values from a nominal reference level.

5b6w Ternary Code

Another vector signaling code herein called "5b6w" is designed to send on a group of six wires 2 "+" signals, 2 "−" signals, and 2 "0" signals. This code is thus "balanced", having the same number of "+" values as "−" values per group, allowing each code to sum to a constant value of zero. A knowledgeable practitioner may note that without additional constraint, a code based on sending 2 "+" signals and 2 "−" signals on every group of 6 wires has 90 distinct combinations, sufficient to encode 6 bits instead of 5. However, as fully described in [Fox III], a subset of 32 code words is used to encode 5 binary bits, with a significantly simplified receiver.

The examples in [Fox III] combine the 5b6w code with an output driver structure optimized to generate three distinct output voltages on a high-impedance CMOS-compatible interconnection with very low power consumption. Examples herein illustrate the combination of 5b6w code and ternary signal levels with output drivers optimized for use with matched impedance terminated transmission lines.

Fully CMOS Output Driver

Figure 3:
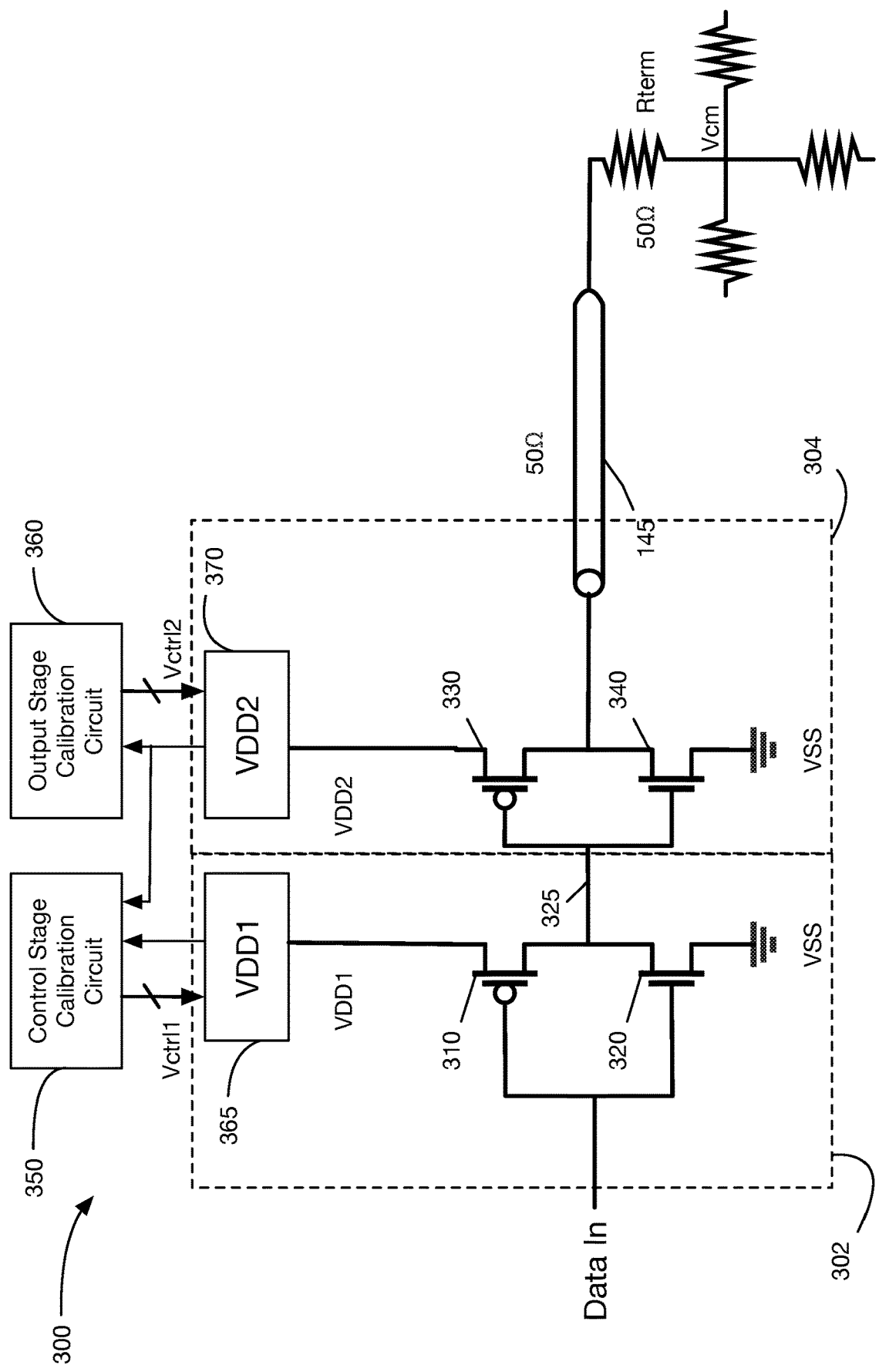
FIG. 3 is a diagram of a line driver having a calibrated output impedance, in accordance with some embodiments.

Embodiments described herein describe a fully-CMOS output line driver and calibration techniques to provide a source impedance matched to that of the characteristic impedance of the transmission line and the termination impedance over process-variation and temperature (PVT). In embodiments described below, a "fully-CMOS" driver may be characterized by the lack of the physically implemented resistive elements connected in series between the field effect transistors (FETs) and the wire of the multi-wire bus, as shown by resistors 210 and 220 of FIG. 2. In such a driver, as shown in FIG. 3, the NMOS and PMOS devices are calibrated with supply voltages that result in the NMOS and PMOS devices having intrinsic impedances that match the characteristic impedance of the transmission line and termination impedance elements. Advantages of such a driver include the ability to continuously perform background calibration. In the driver of FIG. 2, a parallel slice architecture is used to perform impedance matching, whereas the driver of FIG. 3 is calibrated via smooth adjustments to the supply voltages. Furthermore, a larger transistor is required by the driver of FIG. 2 to achieve a lower resistive value, thus the transistors of FIG. 2 consume more power and have higher capacitive loading effects on the wire. The smaller sized transistors of FIG. 3 thus reduce overall power consumption and loading characteristics. Example signal levels, signal frequencies, and physical dimensions described herein are provided for purposes of explanation and are not limiting. While the line driver of FIG. 3 is shown as being terminated at the junction of four wires, it should be noted that alternative numbers of wires may be terminated, such as a single wire for single ended signaling, a pair of wires for differential signaling, or more than two wires for multi-wire vector signaling codes.

Other embodiments of the invention may utilize different signaling levels, connection topology, termination methods, and/or other physical interfaces, including optical, inductive, capacitive, or electrical interconnection. Similarly, examples based on unidirectional communication from transmitter to receiver are presented for clarity of description; combined transmitter-receiver embodiments and bidirectional communication embodiments are also explicitly in accordance with the invention.

FIG. 3 is a schematic of a line driver, in accordance with some embodiments. As shown, the line driver includes a line driver control stage 302 having two C-MOSFETs 310 and 320 having respective source terminals connected to a reference voltage VSS and a control stage supply voltage VDD1, and the drain terminals connected to a control stage output node 325, and configured to controllably provide the reference voltage Vss or the control stage supply voltage VDD1 at the control stage output node 325 in response to a data signal. The line driver 300 further includes a line driver output circuit 304 having a high-side FET circuit 330 and a low-side FET circuit 340, each FET circuit having gate terminal inputs connected to the control stage output node 325, having drain outputs connected to a wire 145 of a multiwire bus, and having respective source nodes connected to an output stage supply voltage VDD2 and the reference voltage VSS. The high-side FET circuit 330 is configured to have an on-resistance associated with a gate-source voltage (Vgs) determined by the reference voltage VSS provided to the gate input and the output stage supply voltage VDD2 provided to the source node of high-side FET circuit 330. Similarly, the low-side FET circuit 340 is configured to have an on-resistance associated with a gate-source voltage determined by the reference voltage VSS connected to the source node and the control stage supply voltage VDD1 connected to the gate input via the control stage output node 325. The term "on-resistance" in this context corresponds to the intrinsic resistance of the high-side and low-side FET circuits when provided with the corresponding gate input voltage that turns on the device, and thus is the effective output impedance of the driver for the given signal level output on the wire. The line driver further includes a control stage calibration circuit 350 (which may also be referred to herein as a "low-side on-resistance calibration circuit") configured to generate the control stage supply voltage VDD1 based on a voltage drop associated with a replica low-side FET circuit relative to a first voltage drop across a first replica termination impedance element. Line driver 300 further includes an output stage calibration circuit 360 (which may also be referred to herein as a "a high-side on-resistance calibration circuit") configured to generate the output stage supply voltage VDD2 based on a voltage drop associated with a replica high-side FET circuit relative to a second voltage drop across a second replica termination impedance element.

Figure 4:
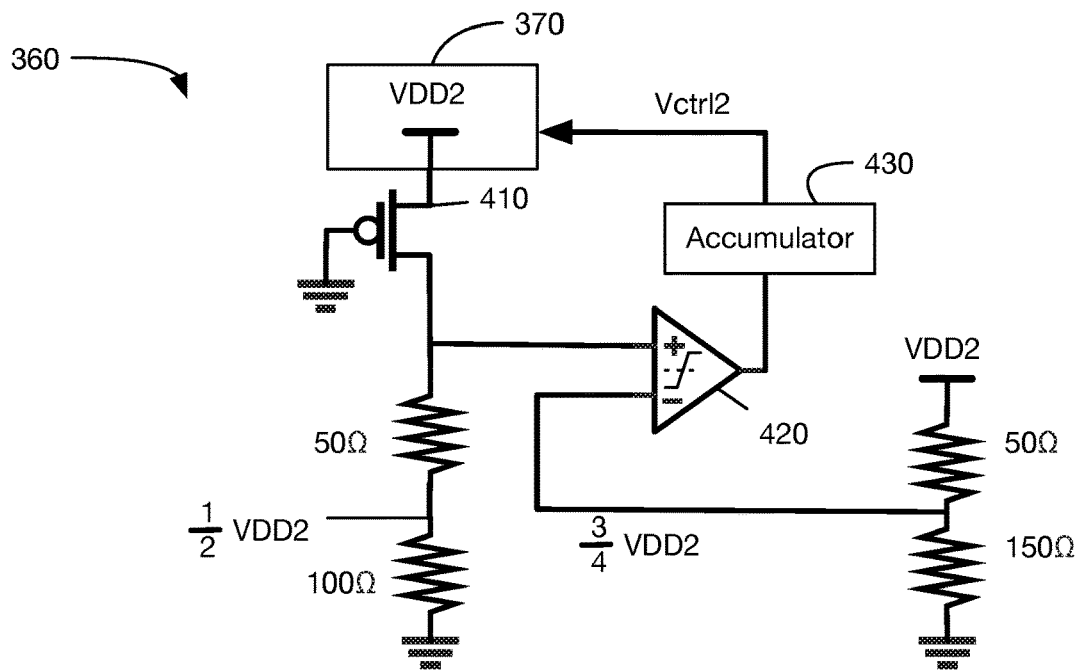
FIG. 4 is a schematic an output stage calibration circuit, in accordance with some embodiments.

FIG. 4 is a schematic of an output stage calibration circuit 360, in accordance with some embodiments. As shown, the output stage calibration circuit 360 includes a voltage divider composed of replica high-side FET circuit 410 and a replica termination impedance element, shown in FIG. 4 as composed of 50-ohm and 100-ohm resistors. The output of the voltage divider is connected to a comparator 420 which outputs comparisons to accumulator 430. As shown, the value ¾ VDD2 is also provided to comparator 420. The voltage ¾ VDD2 may be obtained via a voltage divider composed entirely of resistors and corresponds the voltage output ¾ VDD2. As one will appreciate, the output of the voltage divider containing the replica high-side FET circuit 410 will equal ¾ VDD2 when the high-side replica circuit 410 is configured with a source voltage VDD2 that results in a 50-ohm impedance value. In some embodiments, the comparator 420 may generate comparisons according to a clock signal, such as a 50 MHz system clock. In some embodiments, the comparisons may be accumulated via a least-significant bit position of the accumulator 430, which may include a multi-bit register. The control stage supply voltage VDD2 may be controlled via a most-significant bit (MSB) portion of the register, i.e., the bits of the MSB portion may be provided as a control signal $Vctrl_2$ to voltage regulator 370 generating the second supply voltage VDD2. While the previous example uses a voltage divider having a ¾ output ratio and a replica termination impedance being a scaled (3×) replica of the actual termination impedance, it should be noted that other ratios may be used as well. Specifically, an alternative embodiment may utilize a replica termination impedance element having a 50-ohm resistance in series with the replica high-side FET circuit, and the comparator may receive ½ VDD2 as a comparison value. Such a voltage divider would similarly achieve a 50 ohm on-resistance for the replica high-side FET circuit.

Figure 5:
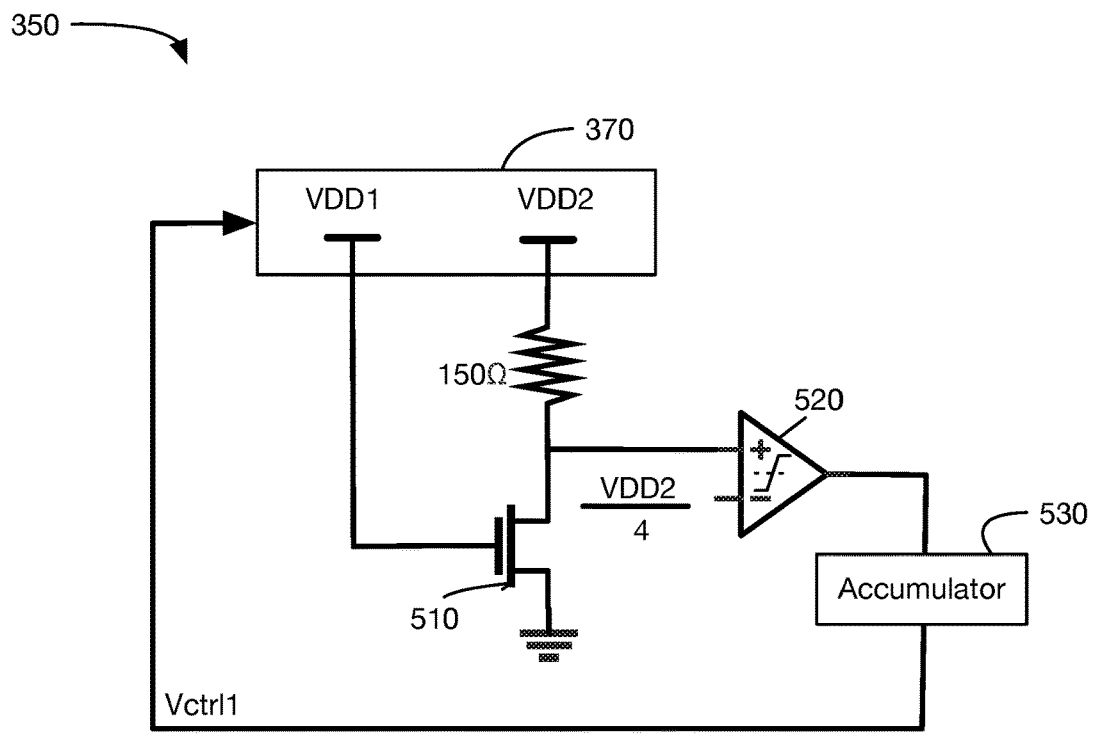
FIG. 5 is a schematic of a control stage calibration circuit, in accordance with some embodiments.

FIG. 5 is a schematic of a control stage calibration circuit 350 that similarly calibrates the control stage supply voltage VDD1 using a similar voltage divider principle. As shown, the control stage calibration circuit 350 includes a replica termination impedance element having a value of 150-ohms connected in series with a replica low-side FET circuit 510. Similar to the output stage calibration circuit, the control stage calibration circuit of FIG. 5 utilizes a ¼ divider ratio to generate an output equal to the lower-value of the voltage output, i.e., ¼ VDD2. The voltage regulator 370 provides the control stage supply voltage VDD1 to the gate input of the replica low-side FET circuit 510, while the source of replica low-side FET circuit 510 is connected to the reference voltage. Outputs of comparator 520 are similarly accumulated 530 to adjust the control stage supply voltage VDD1 via control signal $Vctrl_1$. The replica low-side FET circuit 510 has an impedance of 50-ohms when the output of the voltage divider is equal to ¼ VDD2. In this example, VDD2 is re-used for the voltage divider. However, as the drain voltage of the NMOS replica low-side FET circuit 510 has no effect on the impedance value, it should be noted that an arbitrary reference voltage may be used in place of VDD2.

Figure 9:
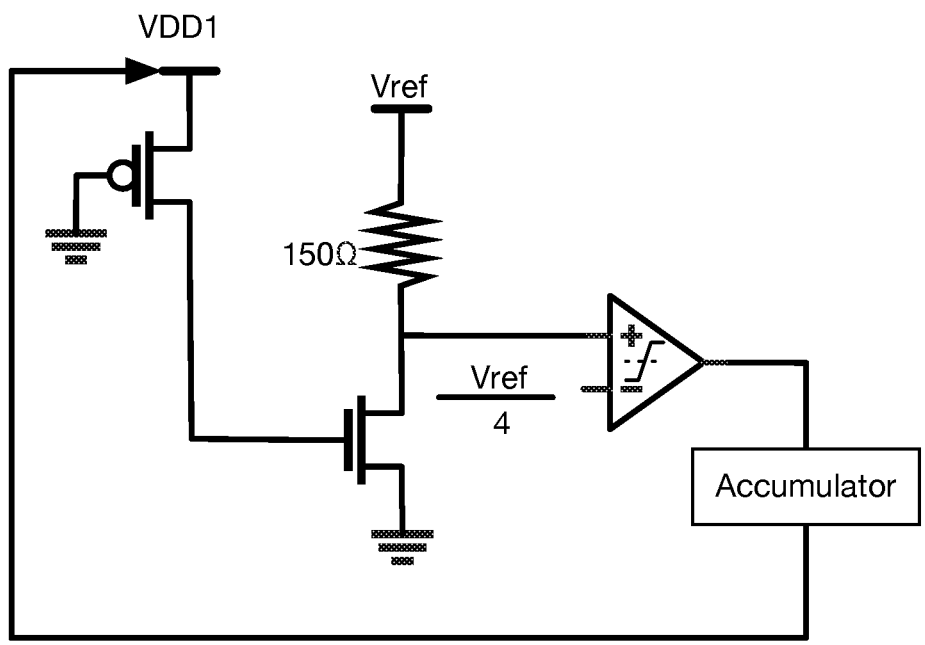
FIG. 9 is a schematic of an alternative implementation of a control stage calibration circuit, in accordance with some embodiments.

FIG. 9 is a schematic of an alternative version of the control stage calibration circuit, in accordance with some embodiments. As shown, the control stage calibration circuit of FIG. 9 includes a replica PMOS device from the line driver control stage. Such an embodiment more closely reflects the architecture of the line driver at the cost of slightly additional complexity. In such an embodiment, the replica PMOS device from the line driver control stage may provide electrostatic discharge (ESD) protection benefits, as well as more accurately account for any leakage current effects.

In some embodiments, the replica termination impedance element for the output stage calibration circuit and control stage calibration circuit may be shared if calibration of the VDD1 and VDD2 supply voltages is done sequentially, i.e., not at the same time. In such an embodiment, the replica termination impedance element may be selectively switched between the two calibration circuits. In some embodiments, each calibration circuit contains their own replica termination impedance elements and calibration of the supply voltages may be performed concurrently.

Figure 6:
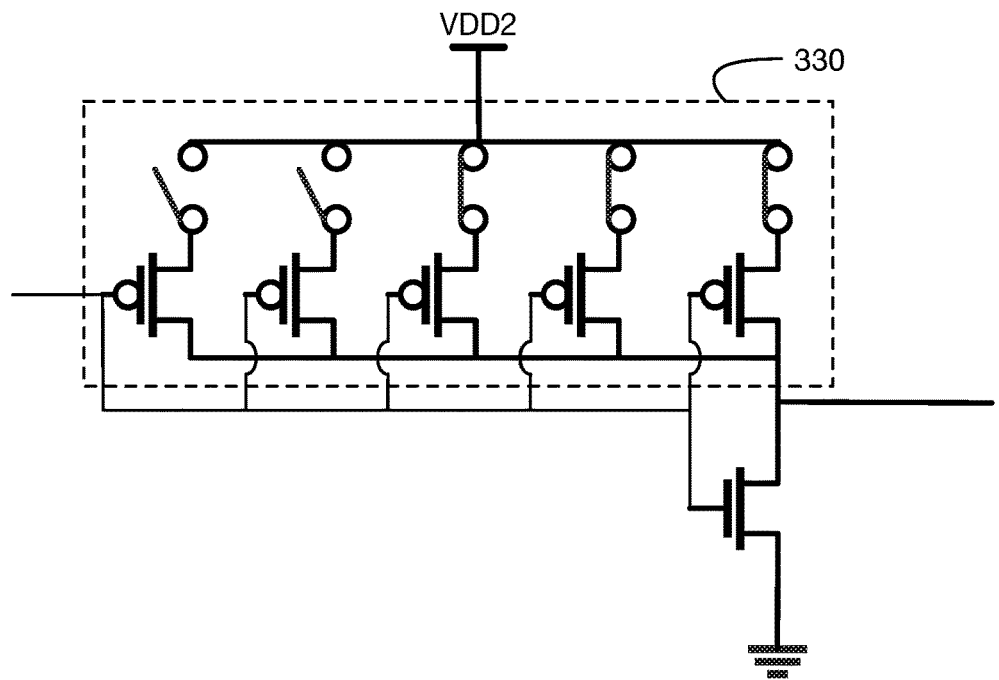
FIG. 6 is a schematic of a high-side Field Effect Transistor (FET) circuit, in accordance with some embodiments.
Figure 7:
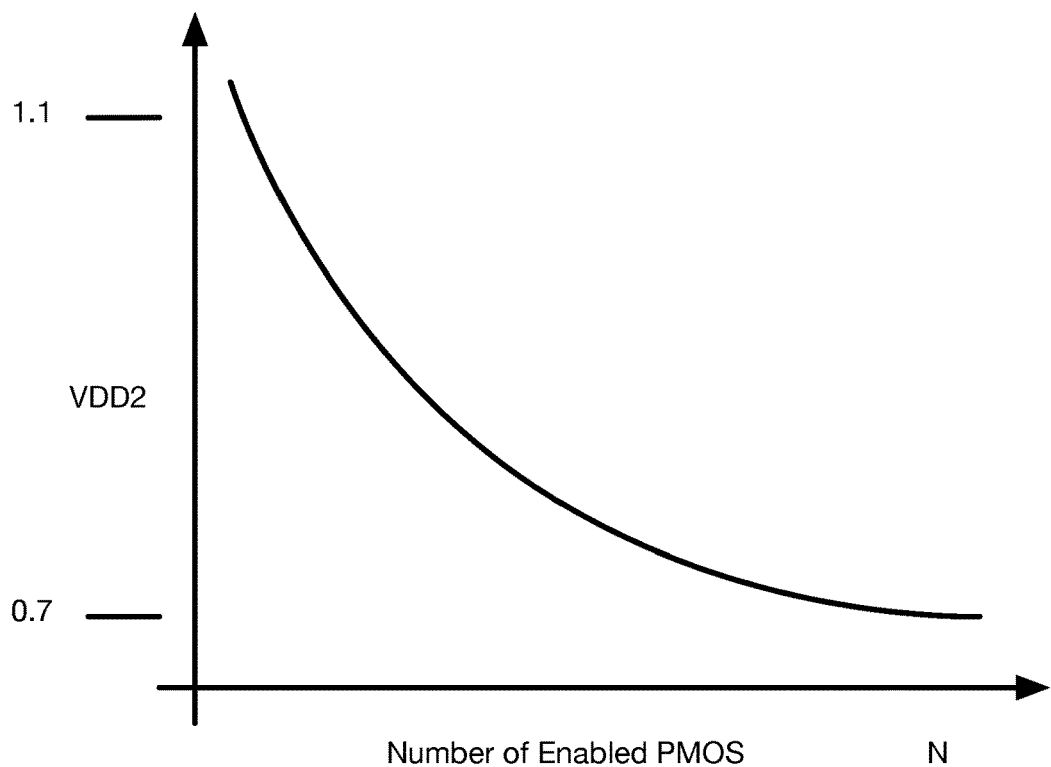
FIG. 7 is a diagram illustrating the supply voltage as a function of number of enabled PMOS circuits in the high-side FET circuit of FIG. 5, in accordance with some embodiments.
Figure 8:
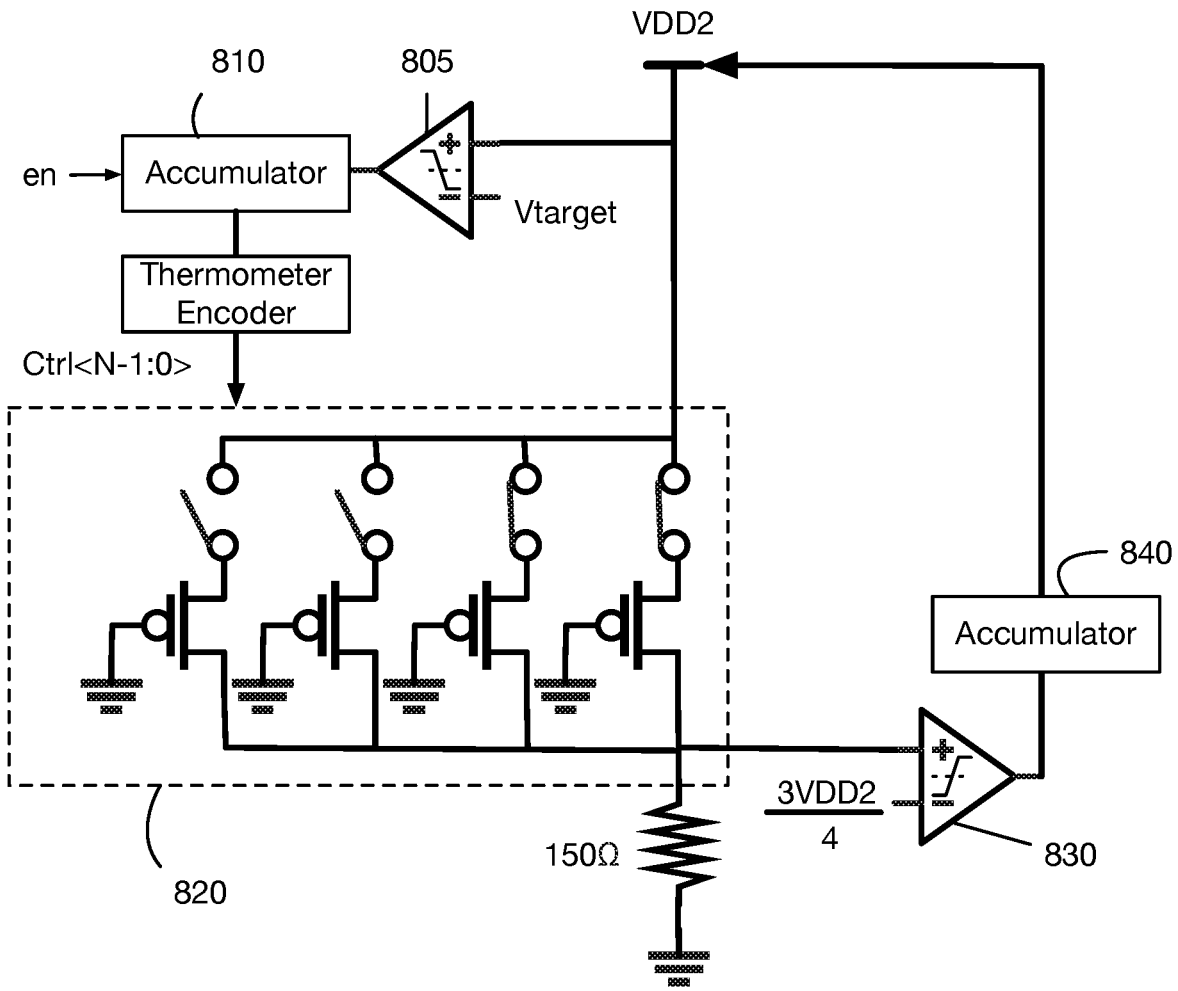
FIG. 8 is a schematic of an alternative implementation of an output stage calibration circuit according to FIG. 5, in accordance with some embodiments.

Embodiments described herein may incorporate added functionality to adjust the output voltage swing by controlling a number of individually enabled FETs connected in parallel. In such embodiments, the high-side FET circuit 330 may include a plurality of PMOS transistors connected in parallel. FIG. 6 is a schematic of a high-side FET circuit 330, in accordance with such embodiments. Furthermore, the graph of FIG. 7 illustrates the relationship between the number of enabled PMOS devices in parallel and the second supply voltage VDD2. One will notice that as more PMOS devices are enabled in parallel, the impedance value of each individually enabled PMOS must increase to maintain the desired overall impedance value of 50 ohms. As the resistance is inversely proportional to the Vgs of the PMOS, Vgs is lowered via VDD2 to increase the resistance. FIG. 8 is a schematic of a high-side on-resistance calibration circuit that further includes a voltage swing calibration circuit, in accordance with some embodiments. As shown in FIG. 8, VDD2 is compared to a target voltage Vtarget that is associated with a desired output swing. The comparisons are accumulated in accumulator 810, e.g., via a LSB position of a register. The MSB portion of accumulator 810 may be converted into a thermometer-coded control signal Ctrl<N−1:0> to control the number of individually enabled PMOS devices in PMOS bank 820. In such an embodiment, n bits of the MSB portion of the accumulator 810 are encoded into $N=2^n$ bits of a thermometer code. Responsive to an addition or removal of a PMOS device, the overall impedance of PMOS bank 820 will change thus inducing the comparator 830 and accumulator 840 to adjust the value of the second supply voltage VDD2 accordingly. In some embodiments, the voltage swing calibration circuit may be enabled for a startup period and subsequently disabled. Such an embodiment is illustrated via the enable signal 'en' provided to accumulator 810. The on-resistance calibration circuit may deviate VDD2 from Vtarget to match the overall impedance of PMOS bank 820 to the characteristic impedance of the wire, but as long as VDD2 remains within a threshold of Vtarget, no additional addition or removal of PMOS devices is required. In some embodiments, if VDD2 deviates too far from Vtarget by a predetermined threshold amount, the voltage swing calibration circuit may be reenabled to recalibrate VDD2. As shown in FIG. 8, each PMOS device may be selectively enabled by a switch receiving a corresponding control bit from the multi-bit control signal Ctrl<N−1:0>. In such embodiments, the switches themselves may be MOSFET switches, however various other switching elements may be used as well.

Figure 10:
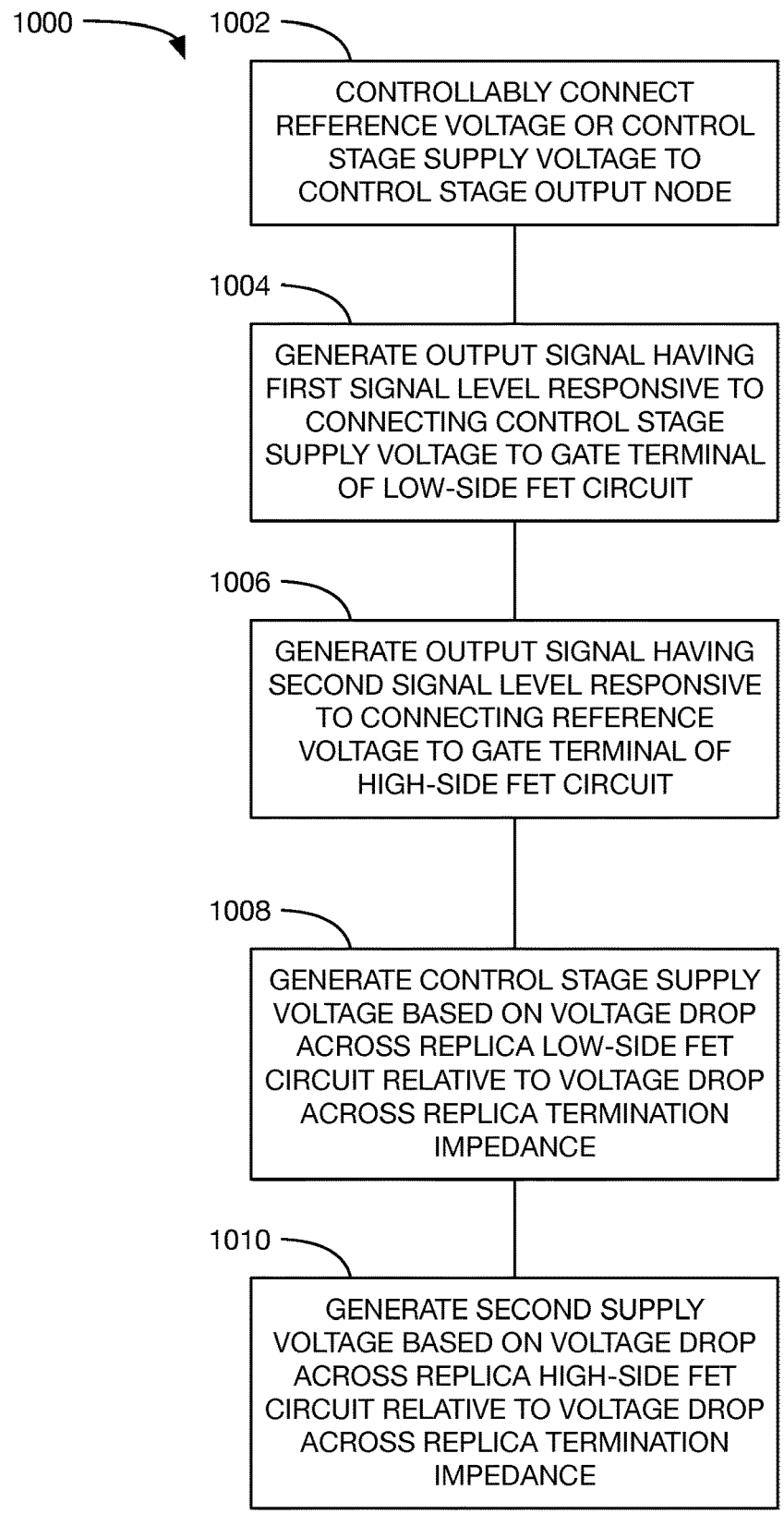
FIG. 10 is a flowchart of a method 1000, in accordance with some embodiments.

FIG. 10 is a method 1000, in accordance with some embodiments. As shown, method 1000 includes controllably connecting 1002 a reference voltage or a first supply voltage to a control stage output node of a line driver control stage responsive to an input data signal. The method further includes generating 1004, responsive to connecting the control stage supply voltage to a gate terminal of a low-side FET circuit connected to the line driver control stage, an output signal on a wire of a multi-wire bus having a first signal level. The low-side FET circuit has an on-resistance associated with a gate-source voltage Vgs determined by the control stage supply voltage and the reference voltage. The method further includes generating 1006, responsive to connecting the reference voltage to a gate terminal of a high-side FET circuit connected to the line driver control stage, the output signal on the wire of the multi-wire bus having a second signal level. The high-side FET circuit has an on-resistance associated with a gate-source voltage Vgs determined by the reference voltage and an output stage supply voltage. The method further includes generating 1008 the control stage supply voltage based on a voltage drop associated with a replica low-side FET circuit relative to a first voltage drop across a first replica termination impedance element. The method further includes generating 1010 the output stage supply voltage based on a voltage drop associated with a replica high-side FET circuit relative to a second voltage drop across a second replica termination impedance element.

In some embodiments, the high-side FET circuit comprises a plurality of individual FETs connected in parallel, and thus generating the second supply voltage further includes selectively enabling a number of individual FETs connected in parallel, calibrating an output voltage swing on the wire of the multi-wire bus. In some such embodiments, the number of individual FETs connected in parallel are enabled responsive to an accumulation of comparisons of the second supply voltage to a target reference voltage. The comparisons may be accumulated in a least-significant bit (LSB) portion of an accumulator, and an MSB portion of the accumulator may control the number of selectively enabled individual FETs in the high-side FET circuit. In some such embodiments, the MSB portion of the accumulator is converted into a thermometer-coded control signal.

In some embodiments, the output stage calibration circuit comprises a plurality of replica individual FETs connected in parallel, and wherein the number of individual FETs selectively enabled in the high-side FET circuit is the same as the number of replica individual FETs selectively enabled in the output stage calibration circuit. Each individual FET may be selectively enabled by a corresponding switching element. In some embodiments, the output voltage swing is calibrated prior to adjusting the first and second supply voltages to calibrate the on-resistances of the low-side and high-side FET circuits, respectively. In some embodiments, VDD1 and VDD2 are generated concurrently. In some embodiments, the first and second replica termination impedances are scaled replicas of a termination impedance connected to the wire of the multi-wire bus.

Fully CMOS Multi-Level Driver

Figure 11:
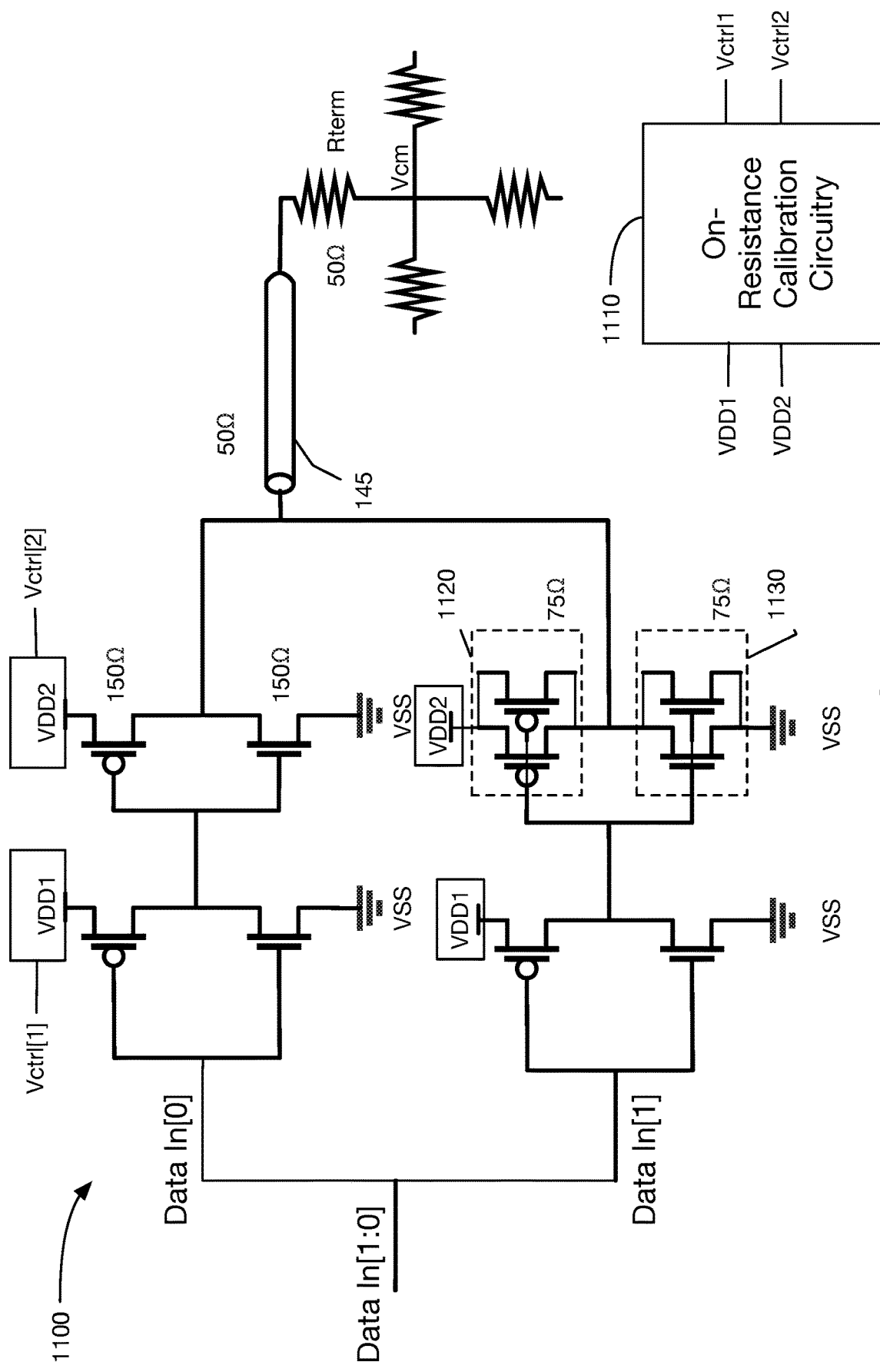
FIG. 11 is a schematic of a shared-supply multi-level line driver 1100 having calibrated output impedance, in accordance with some embodiments.

In the previous examples, the line driver 300 is configured to drive the wire to one of two possible states. However, such a driver may be expanded to operate as multi-level drivers that drive a signal wire to more than two possible signal values. Such embodiments may be useful for e.g., the vector signaling codes described above as well as for pulse amplitude modulation (PAM) codes. FIG. 11 is a schematic of an implementation of a multi-level driver 1100, in accordance with some embodiments. Specifically, FIG. 11 is a four-level driver configured by an input data signal composed of two bits: a most-significant bit (MSB) Data In[1] and a least-significant bit (LSB) Data In[0]. As shown, the multi-level driver 1100 includes a plurality of line driver output circuits connected in parallel: a LSB line driver output circuit and a MSB line driver output circuit configured to receive the LSB and MSB, respectively of the data input. It should be noted that two line driver output circuits should not be considered limiting, as additional line driver output circuits may be included to extend the range of the input bits Data In[1:0] to three, four, or more bits. As shown, both the LSB and MSB line driver output circuits are controlled with VDD1 and VDD2. The FETs of the LSB line driver output circuit are configured with an on-resistance of 150 ohms while the FETs of the MSB line driver output circuit are configured with an on-resistance of 75 ohms. As shown, The MSB line driver output circuit includes two parallel-connected transistors 1120 and 1130 calibrated with on-resistances of 150 ohms to have an overall effective 75-ohm output impedances. As one of the 150-ohm resistors and one of the 75-ohm parallel-connected resistors is enabled for any given input combination, the effective output impedance of the driver is 50 ohms, which matches the characteristic impedance of the transmission line 145 and the termination impedance. The on-resistance calibration circuitry 1110 used to calibrate the control stage supply voltage VDD1 and the output stage supply voltage VDD2 may be similar to the calibration circuits shown in FIGS. 4 and 5. Slight modifications may be made, such as adjusting the values of the voltage dividers to calibrate for a 150-ohm impedance value for the high-side and low-side FETs of FIG. 11, rather than the 50-ohm impedance value for replica high-side and low-side FETs 410 and 510, respectively, of FIG. 3. Furthermore, implementations to adjust the target output voltage swing as described with respect to FIG. 8 may similarly be applied, e.g., by doubling the number of enabled PMOS devices for the MSB line driver output circuit relative to the LSB line driver output circuit. As shown, the multi-level driver 1100 may be configured to generate wire signal voltage outputs of ³⁄₁₂*VDD2, ⁵⁄₁₂*VDD2, ⁷⁄₁₂*VDD2, and ⁹⁄₁₂*VDD2.

Figure 12:
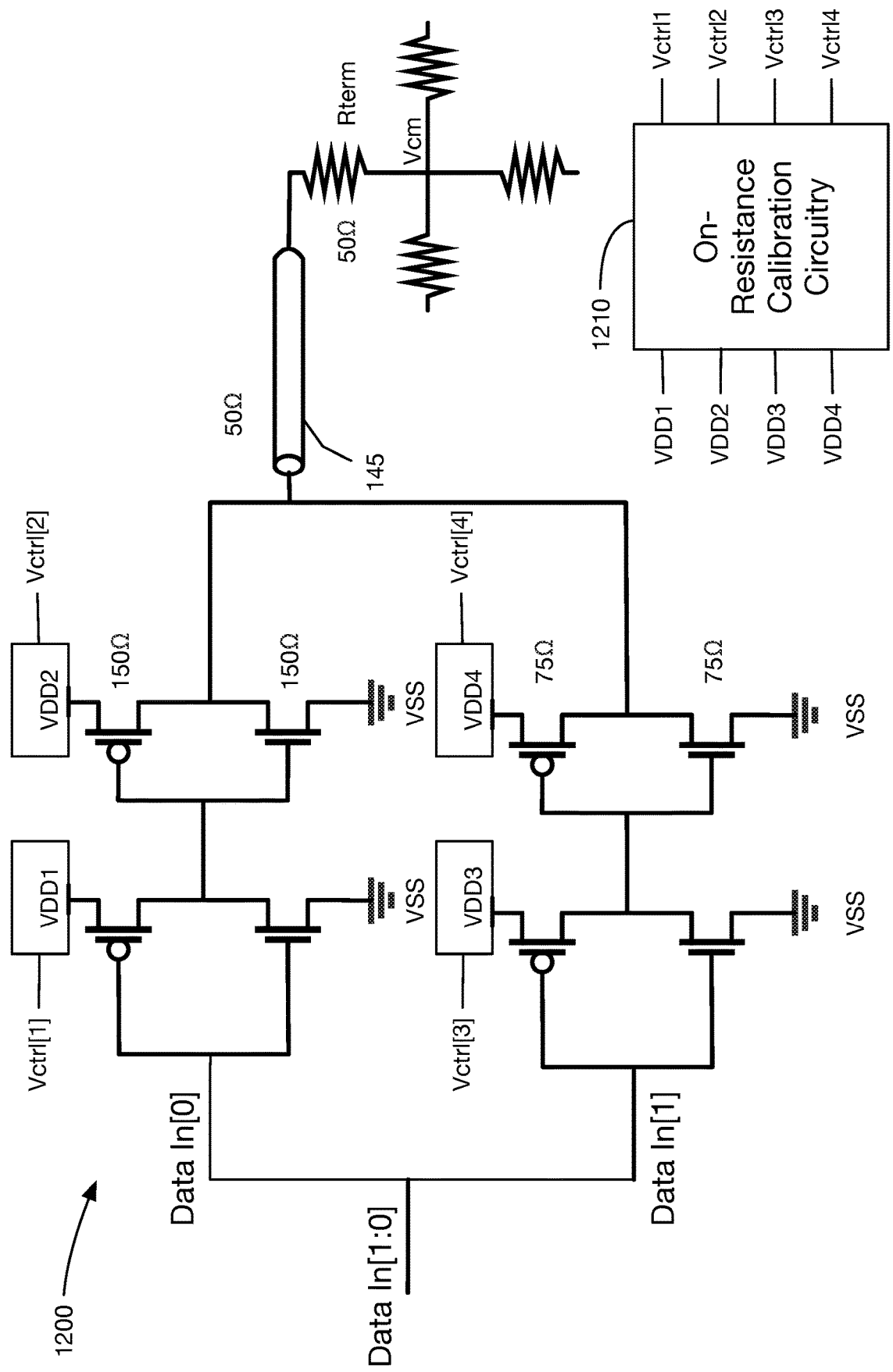
FIG. 12 is a schematic for a multi-level line driver 1200 having a calibrated output impedance, in accordance with some embodiments.

FIG. 12 illustrates another implementation of a fully-CMOS multi-level line driver 1200, in accordance with some embodiments. The multi-level line driver 1200 utilizes a similar concept as the line driver 1100 in FIG. 11 by utilizing a plurality of line driver output circuits connected in parallel to the line driver control stage. In such an embodiment, the LSB and MSB line driver output circuits are calibrated independently using on-resistance calibration circuitry 1210. Specifically, the control stage receives two control stage supply voltages VDD1 and VDD3 and each line driver output circuit has a respective output stage supply voltage VDD2 and VDD4. The high-side FET is calibrated with an on-resistance of 150-ohms using calibrated supply voltage VDD2 provided to the LSB line driver output circuit and the low-side FET is calibrated with an on-resistance of 150 ohms using calibrated supply voltage VDD1 provided to the line driver control stage. Similarly, for the MSB line driver output circuit, the high-side FET is calibrated to have an on-resistance of 75 ohms with supply voltage VDD4 and the low-side FET is calibrated to have an on-resistance of 75 ohms with supply voltage VDD3. On-resistance calibration circuitry 1210 is shown to receive the supply voltages VDD1-VDD4 and to output supply voltage control signals Vctrl[4:1]. As shown, each supply voltage control signal is provided to a corresponding voltage regulator generating one of the supply voltages VDD1-VDD4.

Figure 13:
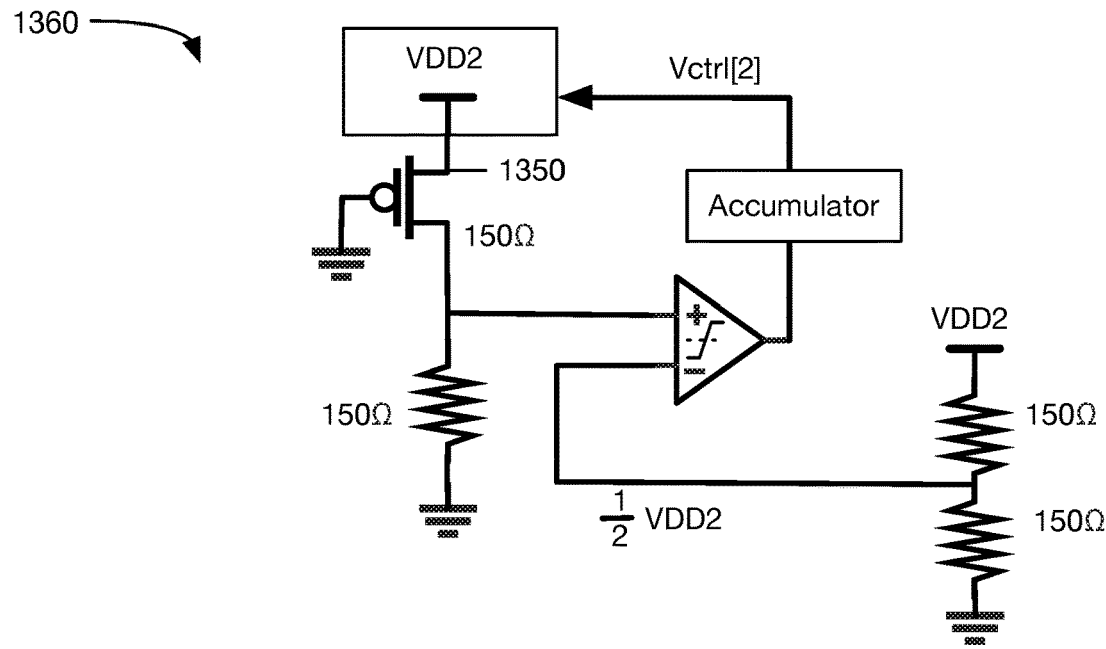
FIG. 13 is a schematic of a output stage calibration circuit for one of the high-side supply voltages for the multi-level line drivers of FIG. 11 or 12, in accordance with some embodiments.
Figure 14:
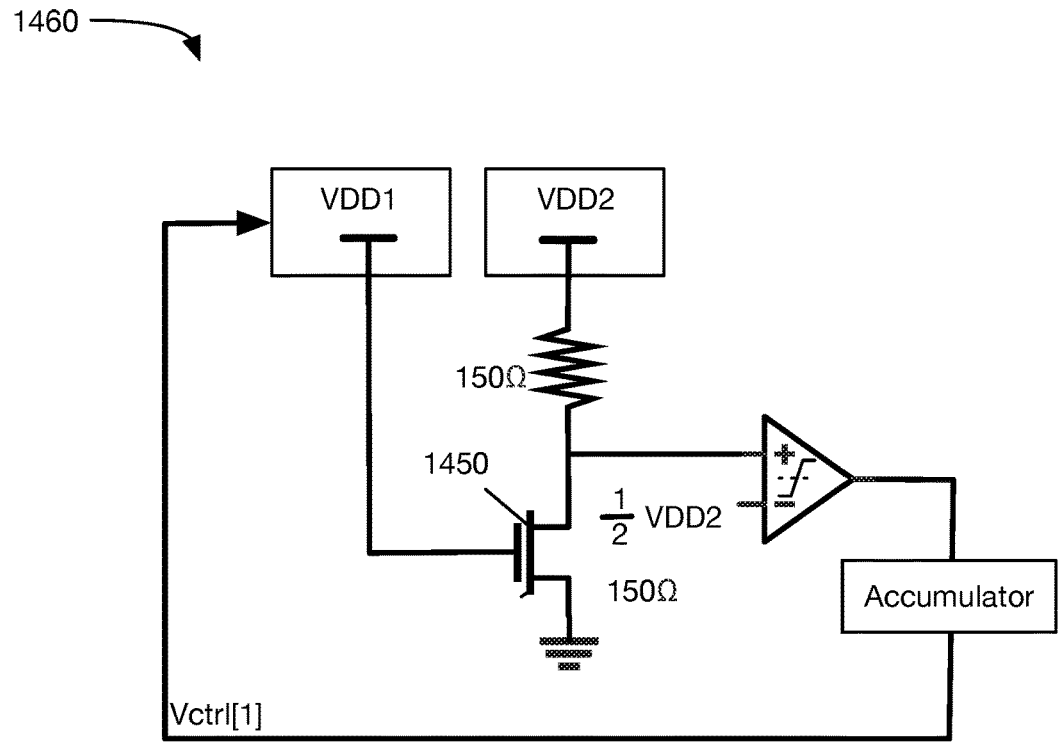
FIG. 14 is a schematic of a control stage calibration circuit for one of the low-side supply voltages for the multi-level line drivers of FIG. 11 or 12, in accordance with some embodiments.
Figure 15:
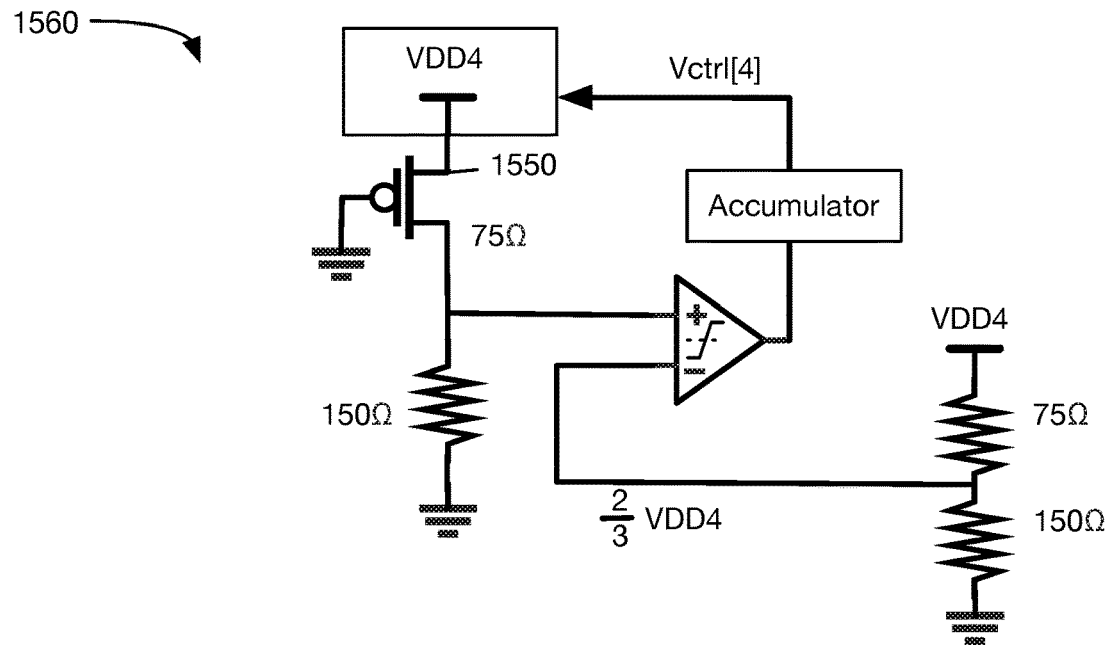
FIG. 15 is a schematic of an output stage calibration circuit for another of the high-side supply voltages for the multi-level line driver of FIG. 12, in accordance with some embodiments.
Figure 16:
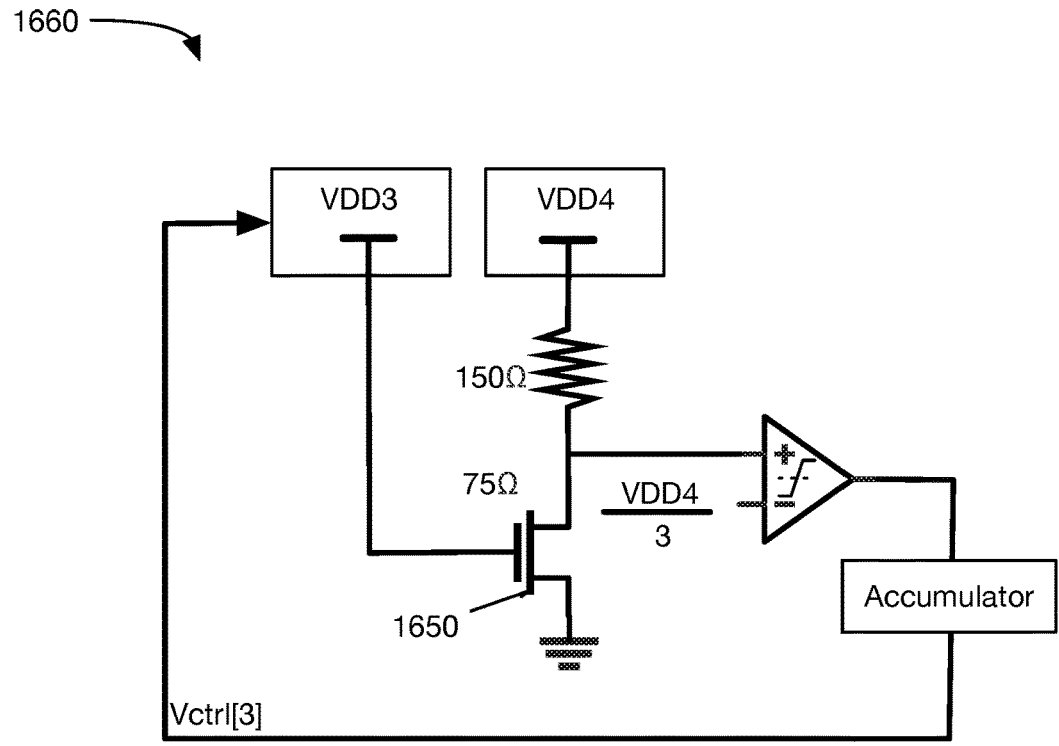
FIG. 16 is a schematic of a control stage calibration circuit for another of the low-side supply voltages for the multi-level line driver of FIG. 12, in accordance with some embodiments.

In such embodiments, the on-resistance calibration circuitry 1210 may include respective high-side and low-side on-resistance calibration circuits for the MSB and LSB line driver output circuits. Exemplary calibration circuits for the multi-level driver of FIG. 11 are shown in FIGS. 13-16. Specifically, FIG. 13 is a high-side on-resistance calibration circuit 1360 that configures the source of high-side FET circuit 1350 with a second supply voltage VDD2 that results in an impedance of 150 ohms. FIG. 14 is a low-side on-resistance calibration circuit 1460 that configures the gate voltage of low-side FET circuit 1450 with a first supply voltage VDD1 that results in an impedance of 150 ohms. Utilizing a different voltage divider ratio, FIGS. 15 and 16 are similar high-side on and low-side on-resistance calibration circuits that calibrate the high-side and low-side FET circuits with on-resistances of 75 ohms, respectively.

While the examples above match the output impedance of the line driver to 50 ohms, it should be noted that such numerical examples are illustrative, and it should be noted that the impedance values may be calibrated differently utilizing e.g., different voltage divider ratios, replica resistive values etc. Furthermore, it should be noted that the concepts described in FIGS. 6-8 related to adjusting the target output voltage swing via enabled parallel FETs similarly may apply to the multi-level line driver embodiment of FIGS. 11-16, although not explicitly shown. FIGS. 11 and 12 depict multi-level drivers configurable to output four wire signal levels, however additional line driver stages may be connected in parallel to extend the number of available wire signal levels, provide pre-equalization, etc.

The examples presented herein illustrate the use of vector signaling codes carried by matched impedance parallel transmission line interconnections for chip-to-chip communication. However, those exemplary details should not been seen as limiting the scope of the described invention. The methods disclosed in this application are equally applicable to other interconnection topologies and other communication media including optical, capacitive, inductive, and wireless communications which may rely on any of the characteristics of the described invention, including but not limited to communications protocol, signaling methods, and physical interface characteristics. Thus, descriptive terms such as "voltage" or "signal level" should be considered to include equivalents in other measurement systems, such as "current", "optical intensity", "RF modulation", etc. As used herein, the term "signal" includes any suitable behavior and/or attribute of a physical phenomenon capable of conveying information. The information conveyed by such signals may be tangible and non-transitory.

We claim:

1. An apparatus comprising:
    a line driver control stage having two field effect transistors (FETs) having respective source terminals connected to a reference voltage and a control stage supply voltage, and the drain terminals connected to a control stage output node, and configured to controllably provide the reference voltage or the control stage supply voltage at the control stage output node in response to a data signal;
    a line driver output circuit having a high-side FET circuit and a low-side FET circuit, each FET circuit having gate terminal inputs connected to the control stage output node, having drain outputs connected to a wire of a multiwire bus, and having respective source nodes connected to an output stage supply voltage and the reference voltage, respectively, the high-side FET circuit configured to have an on-resistance associated with a gate-source voltage determined by the reference voltage and the output stage supply voltage, and the low-side FET circuit configured to have an on-resistance associated with a gate-source voltage determined by the reference voltage and the control stage supply voltage;
    a control stage calibration circuit configured to generate the control stage supply voltage based on a voltage drop associated with a replica low-side FET circuit relative to a first voltage drop across a first replica termination impedance element; and an output stage calibration circuit configured to generate the output stage supply voltage based on a voltage drop associated with a replica high-side FET circuit relative to a second voltage drop across a second replica termination impedance element.

2. The apparatus of claim 1, wherein the high-side FET circuit comprises a plurality of individual FETs connected in parallel.

3. The apparatus of claim 2, further comprising a voltage swing calibration configured to selectively enable a number of individual FETs connected in parallel to adjust an output voltage swing on the wire of the multi-wire bus.

4. The apparatus of claim 3, wherein the voltage swing calibration circuit comprises a comparator configured to accumulate comparisons of the output stage supply voltage to a target reference voltage.

5. The apparatus of claim 4, wherein the comparisons are accumulated in a least-significant bit (LSB) portion of an accumulator, and wherein an MSB portion of the accumulator controls the number of selectively enabled individual FETs in the high-side FET circuit.

6. The apparatus of claim 3, wherein the high-side on-resistance calibration circuit comprises a plurality of replica individual FETs connected in parallel, and wherein the number of individual FETs selectively enabled in the high-side FET circuit is the same as the number of replica individual FETs selectively enabled in the high-side on-resistance calibration circuit.

7. The apparatus of claim 3, wherein the number of selectively enabled individual FETs are controlled via a thermometer-coded control signal.

8. The apparatus of claim 3, wherein each individual FET is selectively enabled by a corresponding switching element.

9. The apparatus of claim 8, wherein the switching element is a MOSFET switch.

10. The apparatus of claim 1, wherein the first and second replica termination impedances are scaled replicas of a termination impedance connected to the wire of the multi-wire bus.

11. A method comprising:
controllably connecting a reference voltage or a control stage supply voltage to a control stage output node of a line driver control stage responsive to an input data signal;
generating, responsive to connecting the control stage supply voltage to a gate terminal of a low-side FET circuit connected to the line driver control stage, an output signal on a wire of a multi-wire bus having a first signal level, the low-side FET circuit having an on-resistance associated with a gate-source voltage determined by the control stage supply voltage and the reference voltage;
generating, responsive to connecting the reference voltage to a gate terminal of a high-side FET circuit connected to the line driver control stage, the output signal on the wire of the multi-wire bus having a second signal level, the high-side FET circuit having an on-resistance associated with a gate-source voltage determined by the reference voltage and an output stage supply voltage;
generating the control stage supply voltage based on a voltage drop associated with a replica low-side FET circuit relative to a first voltage drop across a first replica termination impedance element; and
generating the output stage supply voltage based on a voltage drop associated with a replica high-side FET circuit relative to a second voltage drop across a second replica termination impedance element.

12. The method of claim 11, wherein the high-side FET circuit comprises a plurality of individual FETs connected in parallel, and wherein generating the output stage supply voltage further comprises selectively enabling a number of individual FETs connected in parallel, calibrating an output voltage swing on the wire of the multi-wire bus.

13. The method of claim 12, wherein the number of individual FETs connected in parallel are enabled responsive to an accumulation of comparisons of the output stage supply voltage to a target reference voltage.

14. The method of claim 13, wherein the comparisons are accumulated in a least-significant bit (LSB) portion of an accumulator, and wherein an MSB portion of the accumulator controls the number of selectively enabled individual FETs in the high-side FET circuit.

15. The method of claim 14, further comprising converting the MSB portion of the accumulator into a thermometer-coded control signal.

16. The method of claim 12, wherein the high-side on-resistance calibration circuit comprises a plurality of replica individual FETs connected in parallel, and wherein the number of individual FETs selectively enabled in the high-side FET circuit is the same as the number of replica individual FETs selectively enabled in the high-side on-resistance calibration circuit.

17. The method of claim 12, wherein each individual FET is selectively enabled by a corresponding switching element.

18. The method of claim 12, wherein the control stage and output stage supply voltages are generated after calibrating the output voltage swing.

19. The method of claim 11, wherein the control stage and output stage supply voltages are generated concurrently.

20. The method of claim 11, wherein the first and second replica termination impedances are scaled replicas of a termination impedance connected to the wire of the multi-wire bus.

* * * * *